(12) United States Patent
Hsieh

(10) Patent No.: US 9,159,960 B2
(45) Date of Patent: Oct. 13, 2015

(54) ANNEALING APPARATUS AND ANNEALING METHOD

(71) Applicant: EverDisplay Optronics (Shanghai) Limited, Shanghai (CN)

(72) Inventor: PoChun Hsieh, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 0 days.

(21) Appl. No.: 14/258,865

(22) Filed: Apr. 22, 2014

(65) Prior Publication Data

US 2014/0322843 A1    Oct. 30, 2014

(30) Foreign Application Priority Data

Apr. 26, 2013    (CN) .......................... 2013 1 0150857

(51) Int. Cl.
| H01L 21/00 | (2006.01) |
| H01L 51/56 | (2006.01) |
| H05B 6/72  | (2006.01) |
| H05B 6/80  | (2006.01) |

(52) U.S. Cl.
CPC  *H01L 51/56* (2013.01); *H05B 6/72* (2013.01); *H05B 6/80* (2013.01)

(58) Field of Classification Search
CPC ..... H01L 51/529; H01L 51/5287; H05B 6/72
USPC .................................... 438/89, 799; 219/748
See application file for complete search history.

(56) References Cited

U.S. PATENT DOCUMENTS

| 5,629,054 A * | 5/1997 | Kanai ............................ 427/575 |
| 6,107,614 A * | 8/2000 | Linn et al. ...................... 219/700 |
| 2004/0058800 A1* | 3/2004 | Hasuyama et al. ............. 502/64 |
| 2008/0032066 A1* | 2/2008 | Stiblert et al. ................. 427/595 |
| 2011/0036817 A1 | 2/2011 | Ehrmann et al. |
| 2011/0183495 A1 | 7/2011 | Sousbie et al. |

FOREIGN PATENT DOCUMENTS

| CN | 101034665 A | 9/2007 |
| CN | 101075555 A | 11/2007 |
| CN | 101750790 A | 6/2010 |
| CN | 202013903 U | 10/2011 |

* cited by examiner

*Primary Examiner* — Caridad Everhart
(74) *Attorney, Agent, or Firm* — Andrew F. Young, Esq.; Lackenbach Siegel, LLP

(57) ABSTRACT

The present disclosure relates to an annealing apparatus and an annealing method, which are applied to the packaging art of the AMOLED panel, wherein the annealing apparatus comprises an electromagnetic wave generator coupled with a plurality of irradiators and comprises a plate whose surface is provided with the irradiators and which is placed above or below the AMOLED panel for annealing it. The method comprises the following steps: annealing the AMOLED panel by an annealing apparatus which comprises an electromagnetic wave generator and a plate having lots of irradiators; when the irradiators aim at the annealing area, the annealing areas are annealed by the high frequency electromagnetic wave generated by the electromagnetic wave generator and irradiated from the irradiators. The present disclosure can save the time of the annealing process and can improve the process situation. Meanwhile, the present disclosure increases production yield and improves product quality.

12 Claims, 3 Drawing Sheets

ANNEALING APPARATUS AND ANNEALING METHOD

CROSS-REFERENCE TO RELATED APPLICATIONS

The present application claims priority to and the benefit of Chinese Patent Application No. CN 201310150857.7, filed on Apr. 26, 2013, the entire content of which is incorporated herein by reference.

BACKGROUND OF THE INVENTION

1. Field of the Invention

The present disclosure relates to an annealing apparatus and annealing method for packaging semiconductor product, particularly, to an annealing apparatus and an annealing method applied to packaging the AMOLED panel.

2. Description of the Related Art

Presently, because of the rapid development of the display technology, in the display technology, LCD is being replaced gradually by OLED, i.e., Organic Light Emitting Diode. Because the traditional LCD display can not emit light itself, the backlight modules need to be equipped inside of the LCD screen. However, in OLED, an organic light emitting layer is placed between the two electrodes. When the positive electrons and the negative electrons meet in the organic material, light will be emitted. Because the display screen adopting the OLED display technology will emit light when electronic current passes through, during the production of the display screen, the weight, power consumption and volume of lamps can be avoided. Therefore, the product is thinner, and the operating voltage is lower. Furthermore, the response time and the color of OLED give a good advantage over LCD, so it has a very wide range of applications.

In the OLED technology, according to the driving mode, OLED can be divided into passive organic light emitting diode panels and active organic light-emitting diode panels. Because the active organic light-emitting diode panels can be produced in a large size, can consume less energy, and can achieve the high resolution and long working life, the active organic light emitting diode display panel technology is deemed to be the development orientation of the display technology.

However, the active organic light emitting diode panel technology also has its shortcomings, such as the higher TFT variability, the complicated production process. The complication in the production process is mainly reflected in the manufacturing process and packaging process.

In the related art concerning the AMOLED packaging process, FRIT sintering technology, ODF manufacture technology and Getter coating technology are commonly applied. In these packaging technologies wherein the package is achieved by laser adopting the glass cover plate. In this process, the laser will heat the glass cover plate, causing overproduction of energy. If the surplus energy can not be removed immediately, the stress in the surface of the glass will increase. Furthermore, during the package process, in order to save material as much as possible, the glass cover plate which are used to package are arranged as close as possible, causing the stress between the adjacent areas during the laser package process. Therefore, the yield in the subsequent cutting process reduces. To solve this problem, there are two solutions being provided. One solution is sintering the glass substrates again by the laser head which has been applied in the laser package process to anneal and to remove the stress. However, because of the low speed to achieve the annealing it can not be used into the industrial production on a large scale. The other solution is reducing the distance between the adjacent glasses over plate to increase the distance between the adjacent areas. There are enough spaces for dissipating stress to ensure the yield of the subsequent cutting process. However, actually, the second method is used rarely, because the cost of this method is too high.

Therefore, an annealing art for the AMOLED packaging process which can applicable for the production on a large scale and, meanwhile, can reduce the cost of the production for AMOLED packaging process will be wanted.

SUMMARY OF THE INVENTION

An aspect of an embodiment of the present disclosure is directed toward an annealing apparatus capable of solving the problem of high cost of the annealing process in AMOLED packaging process.

Another aspect of an embodiment of the present disclosure is directed toward an annealing method using the annealing apparatus.

An embodiment of the present disclosure provides an annealing apparatus, comprising:

an electromagnetic wave generator used to controllably generate high frequency electromagnetic wave;

a plurality of irradiators distributed on a plate of the annealing apparatus, coupled with the electromagnetic wave generator, for radiating the high frequency electromagnetic wave generated from the electromagnetic wave generator.

According to one embodiment of the present disclosure, wherein distribution of the irradiators matches with distribution of an annealing areas on a substrate which needs to be annealed.

According to one embodiment of the present disclosure, wherein the plate is formed as a roller structure rolled by a rolling apparatus.

According to one embodiment of the present disclosure, wherein the roller structure is a circular cylinder.

According to one embodiment of the present disclosure, wherein the roller structure is a prismoid.

According to one embodiment of the present disclosure, wherein a shape of each of the irradiators is rectangular; and the sizes of the irradiators are identical.

According to one embodiment of the present disclosure, wherein frequency of the high frequency electromagnetic wave generated from the electromagnetic wave generator is no less than 100 KHz.

Another embodiment of the present disclosure provides an annealing method, comprising:

(a) providing an annealing apparatus comprising an electromagnetic wave generator coupled with a plurality of irradiators distributed on a plate, and a substrate having a plurality of annealing areas which needs to be annealed;

(b) positioning the plate above/below the substrate; and (c) annealing the annealing areas by the high frequency electromagnetic wave generated by the electromagnetic wave generator and irradiated from the irradiators, when the irradiators aim at the annealing areas;

wherein, distribution of irradiators is identical with distribution of the annealing areas.

According to another embodiment of the present disclosure, wherein Step (c) further comprises:

(c1) rolling the plate as a circular cylinder;

(c2) changing the relative position relationship between the plate and the substrate by rolling the circular cylinder for a period of time, during which the annealing areas are annealed by the high frequency electromagnetic wave generated by the electromagnetic wave generator and irradiated from the irradiators.

According to another embodiment of the present disclosure, wherein the temperature of annealing ranges from 500° C. to 550° C.

According to another embodiment of the present disclosure, wherein the irradiator starts irradiating the high frequency electromagnetic wave when the irradiator is rolled to the position directly above/below the substrate while the circular cylinder is rolling.

According to another embodiment of the present disclosure, wherein the shapes of each annealing area are identical; and the shapes of each irradiator are identical.

According to another embodiment of the present disclosure, wherein the shapes of each irradiator are rectangular.

According to another embodiment of the present disclosure, wherein in Step (b), the plate is positioned above/below the substrate horizontally.

According to another embodiment of the present disclosure, wherein the frequency of the high frequency electromagnetic wave is not less than 100 KHz.

BRIEF DESCRIPTIONS OF THE DRAWINGS

The accompanying drawings, together with the specification, illustrate exemplary embodiments of the present disclosure, and, together with the description, serve to explain the principles of the present disclosure.

DETAILED DESCRIPTIONS

Figure 1:
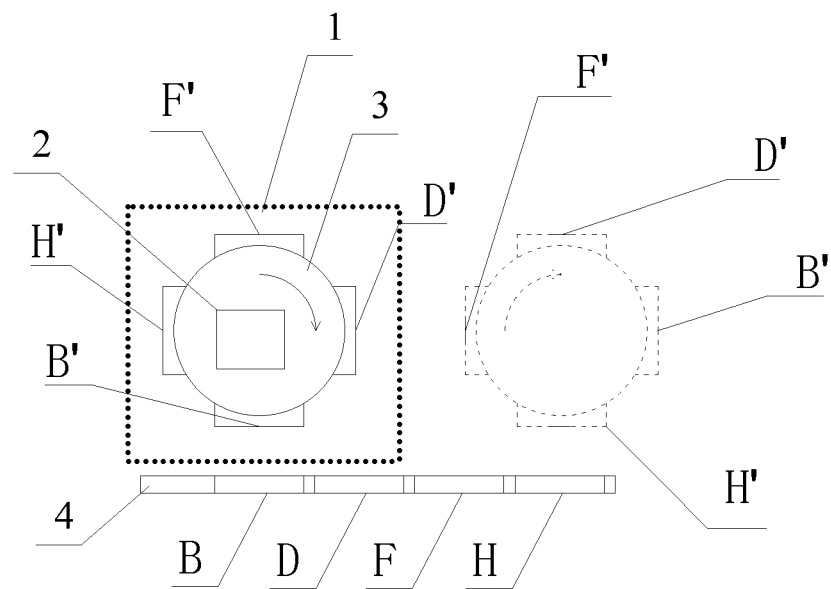
FIG. 1 shows a side view of annealing an AMOLED panel by the annealing apparatus in Embodiment 1 of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

EMBODIMENT 1

FIG. 1 shows a side view of annealing an AMOLED panel 4 by the annealing apparatus 1 in Embodiment 1 of the present disclosure. As shown in FIG. 1, the annealing apparatus 1 comprises an electromagnetic wave generator 2 for annealing the AMOLED, i.e., the active matrix organic light-emitting diode panel 4. The annealing apparatus 1 also comprises a plate 3. The plate 3 can be designed as a plate-shaped structure or a roller structure. The plate 3 is rolled as a roller structure rolled by a rolling apparatus, when the annealing apparatus 1 is working. In the case of the plate-shaped structure, it can anneal the entire AMOLED panel 4 in one time. In the case of the roller structure, the plate 3 must change its position relative to the position of the AMOLED panel 4 to anneal the entire AMOLED panel 4. However, the plate-shaped structure is suitable for annealing the small panel 4 while the roller structure is not only suitable for annealing the small panel 4 but also suitable for the large panel 4. Therefore, in this embodiment, the roller structure is preferable for the plate 3.

The annealing apparatus 1 also comprises a plurality of irradiators. The irradiators are coupled with the electromagnetic wave generator 2 and placed on the surface of the plate 3. Accordingly, when the plate 3 is rolled as a roller structure, the plate 3 can drive the irradiators on its surface to move together with it when rolling. The irradiators can be distributed in various forms on the surface of the plate 3, for example, there is a plurality of trenches at the surface of the plate 3, and each irradiator is located in a trench, and for another example, there is a plurality of boxes at the surface of the plate 3, and each irradiator is located in a box. It should be understood that the plate 3 may be rolled as a circular cylinder or a prismoid.

Figure 2:
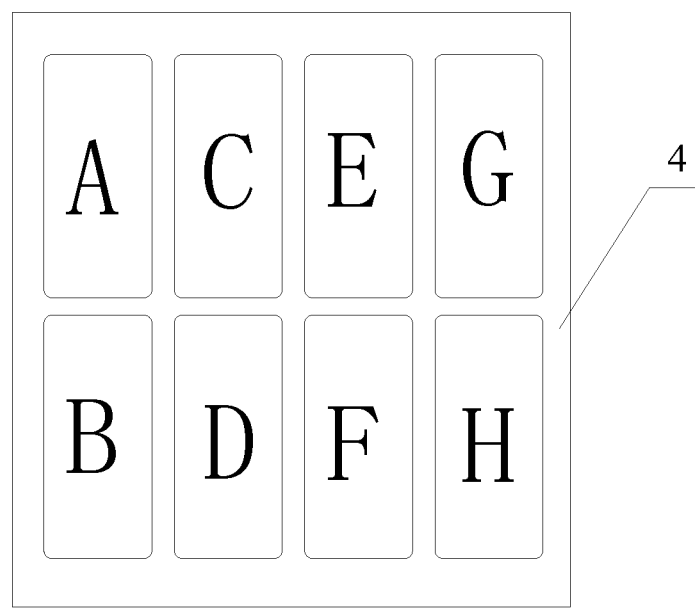
FIG. 2 shows a top view of the AMOLED distributed in the glass substrate in Embodiment 1 of the present disclosure.

FIG. 2 shows a top view of the AMOLED distributed in the glass substrate in Embodiment 1 of the present disclosure. As shown in FIG. 2, 8 AMOLED devices which have been packaged by the laser annealing process are distributed in the glass substrate. Specifically, the 8 AMOLED devices are corresponding to Area A, Area B, Area C, Area D, Area E, Area F, Area G and Area H respectively. The 8 AMOLED devices are arranged in a matrix form, in the present embodiment, such as the 2×4 matrix, wherein the distances between the adjacent AMOLED devices are equal, and are less than 3 mm. The distance between the adjacent AMOLED devices is too short, therefore, after the laser packaging process, at the edge of each AMOLED device, the stress concentration region will be generated, i.e., the region needs annealing is generated, as the shaded region shown in FIG. 2.

The shapes and the distribution of the irradiators placed on the plate 3 will be described in detail in the following contents.

Figure 3:
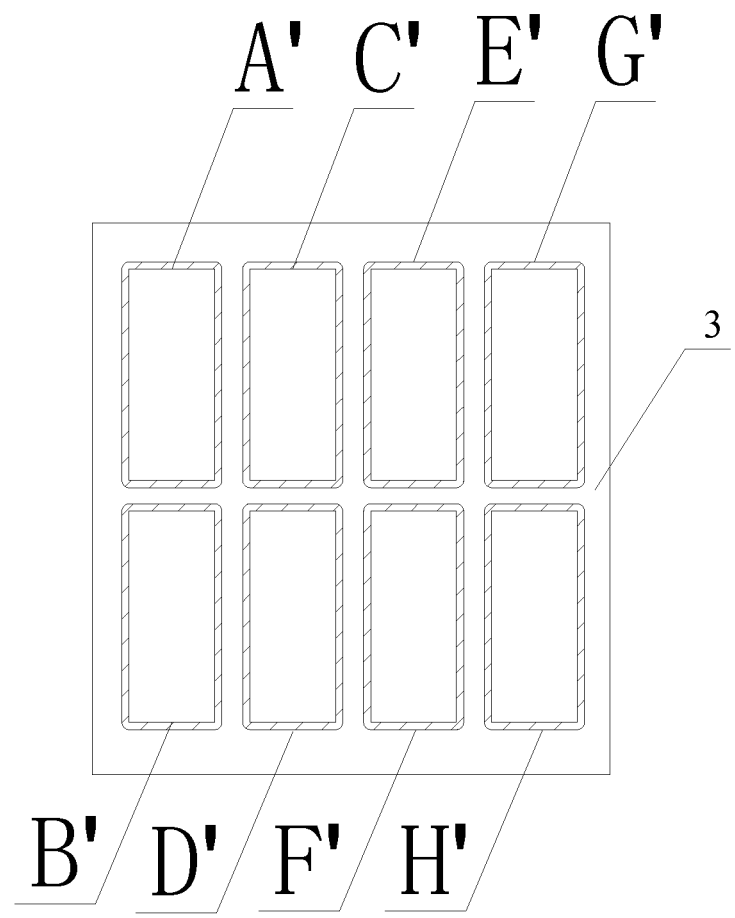
FIG. 3 shows the plane figure of the plate in Embodiment 1 of the present disclosure.

In the plane figure of the surface of the plate 3 on which the irradiators are placed, each area where an irradiator is provided matches with an annealing area in the AMOLED panel 4. Specifically, as shown in FIG. 3, Area A', Area B', Area C', Area D', Area E', Area F', Area G' and Area H' indicate the irradiators distributed on the surface of the plate 3 respectively, wherein, Area A' has the same contour shape as Area A, that means Area A' has the same shape as Annealing Area A. Similarly, Area B' has the same shape as Annealing Area B, Area C' has the same shape as Annealing Area C, Area D' has the same shape as Annealing Area D, Area E' has the same shape as Annealing Area E, Area F' has the same shape as Annealing Area F, Area G' has the same shape as Annealing Area G, Area H' has the same shape as Annealing Area H.

The annealing method of this embodiment is carried out as below:

When the above-mentioned annealing apparatus 1 is applied to anneal the AMOLED panel 4, the plate 3 can be placed above or below the glass substrate. In this embodiment, the plate 3 is placed above the glass substrate. As shown in FIG. 1, positioning the plate 3 above the glass substrate, making Area A' and Area B' be above Area A and Area B separately. Then the high frequency electromagnetic waves are generated by the electromagnetic wave generator 2 and are irradiated from the irradiators in Area A' and Area B' respectively to Annealing Area A and Annealing Area B. The high frequency electromagnetic waves are irradiated to Annealing Area A and Annealing Area B for a period of time to complete the annealing. Then, rolling the circular-cylinder-shaped plate 3 to the right direction, which makes Area C' and Area D' be above Area C and Area D separately. Similarly, the irradiators in Area C' and Area D' irradiates the high frequency electromagnetic waves to Area C and Area D in the glass substrate. After a period of time, repeating the operation of rolling and irradiating as above-mentioned, until the plate 3 has rolled for a round, to irradiate all of the annealing areas in the glass substrate. Then the whole annealing process is completed.

In the annealing process, the two factors affecting the high frequency annealing should be controlled. The first factor is the frequency of the high frequency electromagnetic waves. The frequency more than 100 KHz can be selected, such as 100 KHz, 200 KHz, 300 KHz, 350 KHz or 450 KHz. The second factor is the temperature of the annealing process. The temperature of the glass substrate can be controlled within the range of 500° C. to 550° C., such as 500° C., 510° C., 520° C., 540° C. or 550° C.

EMBODIMENT 2

In this embodiment, comparing with the first preferable embodiment, the rolling apparatus only rotates around its own axis, but its position is not moved. Meanwhile the glass substrate moves.

In this embodiment, the structure of the annealing apparatus 1 and the annealing area of the AMOLED panel 4 are same as those in Embodiment 1.

Figure 4:
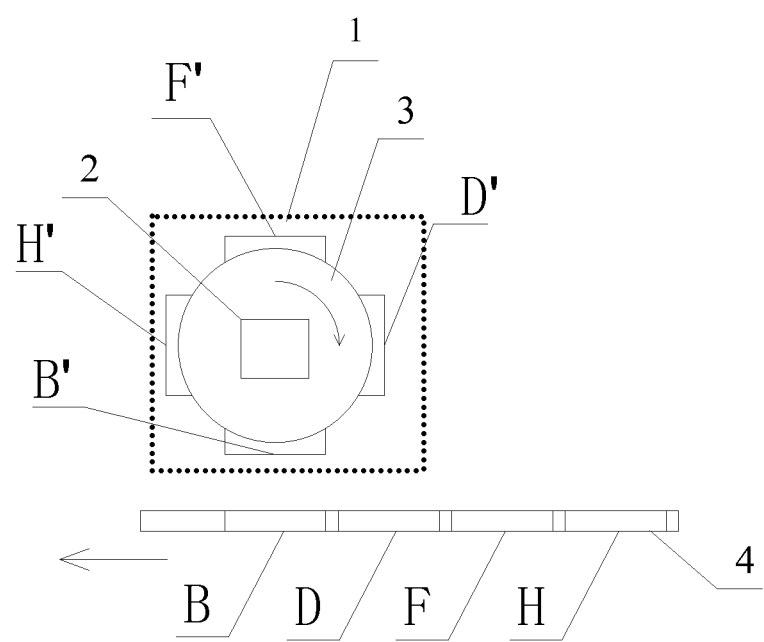
FIG. 4 shows a side view of annealing an AMOLED panel by the annealing apparatus in Embodiment 2 of the present disclosure.

FIG. 4 shows a side view of annealing an AMOLED panel 4 by the annealing apparatus 1 in Embodiment 2 of the present disclosure. When the above-mentioned annealing apparatus 1 is applied to anneal the AMOLED panel 4, the plate 3 can be placed above or below the glass substrate. In this embodiment, the plate 3 is placed above the glass substrate. As shown in FIG. 4, positioning the plate 3 above the glass substrate, making Area A' and Area B' be above Area A and Area B separately. Then the high frequency electromagnetic waves are generated by the electromagnetic wave generator 2 and are irradiated from the irradiators in Area A' and Area B' respectively to Area A and Area B; the electromagnetic wave generator 2 can be fixed in the plate 3 as FIG. 1 shows, it also can be placed out of the plate 3 just coupled with the irradiators. The high frequency electromagnetic waves are irradiated to Area A and Area B for a period of time to complete the annealing. Then, the plate 3 rotates clockwise, which makes the irradiators in Area C' and Area D' directly downwards respectively. Meanwhile, the glass substrate below the plate 3 horizontally moves left. When the irradiators in Area C' and Area D' are directly above Area C and Area D respectively, the irradiators irradiate the high frequency electromagnetic waves to Area C and Area D of the glass substrate for a period of time. Then, repeating the operation of rotating and irradiating as above-mentioned, until the plate 3 has rotated for a whole circle, irradiate all of the annealing areas in the glass substrate.

In this embodiment, the frequency of the high frequency electromagnetic waves and the temperature of the glass substrate during the high frequency annealing can be controlled in the same range as those in Embodiment 1.

Furthermore, if the plate 3 is placed below the glass substrate, the plate 3 can rotate counterclockwise. Correspondingly, when moved to the position below the corresponding annealing area, the irradiators start irradiating the high frequency electromagnetic waves to the annealing area.

Particularly, whatever the plate 3 is placed above or below the glass substrate, the electromagnetic wave generator 2 generates the high frequency electromagnetic waves when the irradiators move to the position between the plate 3 and the glass substrate. Preferably, the irradiators are located at the middle point of the distance between the plate 3 and the glass substrate, and the high frequency electromagnetic waves are irradiated towards the annealing area of the glass substrate perpendicularly.

In conclusion, the annealing apparatus 1 of the present disclosure adopts the high frequency wave process and the rolling cylinder structure. The shapes and distribution of the irradiators on the rolling cylinder are identical with the annealing areas. During the annealing process, only by rolling the plate 3 from one side of the AMOLED panel 4 to the other side, an annealing process for the whole panel 4 can be achieved. Compared to the conventional annealing process performed by laser head, the present disclosure saves time. Furthermore, in the annealing process, high frequency electromagnetic waves are applied to heat, the heat remains in the panel 4 for a shorter time without additional stress. Therefore, compared to the conventional laser annealing, the annealing effect of the present disclosure is better.

Therefore, the annealing apparatus 1 and the annealing method of the present disclosure can save the time for the annealing process and improve the process situation. Meanwhile, the present disclosure increases production yield and improves product quality.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An apparatus for providing annealing process to a glass substrate, comprising:
   an electromagnetic wave generator used to controllably generate high frequency electromagnetic wave; and
   a plurality of irradiators distributed on a plate of the apparatus, coupled with the electromagnetic wave generator, for radiating the high frequency electromagnetic wave generated from the electromagnetic wave generator;
   wherein, distribution of the irradiators matches with distribution of annealing areas on the glass substrate; and
   the plate is formed as a roller structure rolled by a rolling apparatus.

2. The apparatus as claimed in claim 1, wherein the roller structure is a circular cylinder.

3. The apparatus as claimed in claim 1, wherein the roller structure is a prismoid.

4. The apparatus as claimed in claim 1, wherein a shape of each of the irradiators is rectangular; and sizes of the irradiators are identical.

5. The apparatus as claimed in claim 4, wherein frequency of the high frequency electromagnetic wave generated from the electromagnetic wave generator is no less than 100 KHz.

6. A method for annealing a glass substrate, comprising:
   (a) providing an annealing apparatus comprising an electromagnetic wave generator coupled with a plurality of irradiators distributed on a plate, and the glass substrate having a plurality of annealing areas which needs to be annealed;
   (b) positioning the plate above/below the glass substrate; and
   (c) annealing the annealing areas by high frequency electromagnetic wave generated by the electromagnetic wave generator and irradiated from the irradiators, when the irradiators aim at the annealing areas;
   wherein, distribution of the irradiators is identical with distribution of the annealing areas; and
   wherein step (c) further comprises:
      (c1) rolling the plate as a circular cylinder;
      (c2) changing the relative position relationship between the plate and the glass substrate by rolling the circular cylinder for a period of time, during which the annealing areas are annealed by the high frequency electromagnetic wave generated by the electromagnetic wave generator and irradiated from the irradiators.

7. The method as claimed in claim 6, wherein the temperature of annealing ranges from 500° C. to 550° C.

8. The method as claimed in claim 6, wherein in Step (b), the plate is positioned above/below the glass substrate horizontally.

9. The method as claimed in claim 6, wherein frequency of the high frequency electromagnetic wave is not less than 100 KHz.

10. The method as claimed in claim 6, wherein the irradiator starts irradiating the high frequency electromagnetic wave when the irradiator is rolled to the position directly above/below the glass substrate while the circular cylinder is rolling.

11. The method as claimed in claim 10, wherein shapes of the annealing areas are identical; and shapes of the irradiators are identical.

12. The method as claimed in claim 11, wherein a shape of each irradiator is rectangular.

* * * * *